United States Patent
Fujita et al.

(10) Patent No.: US 9,842,675 B2
(45) Date of Patent: Dec. 12, 2017

(54) METAL NITRIDE MATERIAL FOR THERMISTOR, METHOD FOR PRODUCING SAME, AND FILM TYPE THERMISTOR SENSOR

(71) Applicant: MITSUBISHI MATERIALS CORPORATION, Tokyo (JP)

(72) Inventors: Toshiaki Fujita, Naka (JP); Hiroshi Tanaka, Naka (JP); Noriaki Nagatomo, Naka (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 89 days.

(21) Appl. No.: 14/895,769

(22) PCT Filed: May 27, 2014

(86) PCT No.: PCT/JP2014/064567
§ 371 (c)(1),
(2) Date: Dec. 3, 2015

(87) PCT Pub. No.: WO2014/196488
PCT Pub. Date: Dec. 11, 2014

(65) Prior Publication Data
US 2016/0133363 A1 May 12, 2016

(30) Foreign Application Priority Data
Jun. 5, 2013 (JP) .................. 2013-119165

(51) Int. Cl.
*H01C 7/10* (2006.01)
*H01C 7/00* (2006.01)
(Continued)

(52) U.S. Cl.
CPC ......... *H01C 7/008* (2013.01); *C23C 14/0036* (2013.01); *C23C 14/0676* (2013.01);
(Continued)

(58) Field of Classification Search
CPC .......... H01C 7/006; H01C 7/008; H01C 7/04; H01C 17/12; C23C 14/0036; C23C 14/0676
(Continued)

(56) References Cited

U.S. PATENT DOCUMENTS 6,989,574 B2 * 1/2006 Parsons .................. H01C 7/022
257/417
2004/0224459 A1 * 11/2004 Nishikawa .............. C30B 23/02
438/202
(Continued)

FOREIGN PATENT DOCUMENTS

JP 63-096262 A 4/1988
JP 05-090011 A 4/1993
(Continued)

OTHER PUBLICATIONS

International Search Report dated Aug. 26, 2014, issued for PCT/JP2014/064567.

*Primary Examiner* — Kyung Lee
(74) *Attorney, Agent, or Firm* — Locke Lord LLP

(57) ABSTRACT

Provided are a metal nitride material for a thermistor, which has a high heat resistance and a high reliability and can be directly deposited on a film or the like without firing, a method for producing the same, and a film type thermistor sensor. The metal nitride material for a thermistor consists of a metal nitride represented by the general formula: $V_xAl_y(N_{1-w}O_w)_z$ (where $0.70 \leq y/(x+y) \leq 0.98$, $0.45 \leq z \leq 0.55$, $0 < w \leq 0.35$, and $x+y+z=1$), wherein the crystal structure thereof is a hexagonal wurtzite-type single phase. The method for producing the metal nitride material for a thermistor includes a deposition step of performing film deposition by reactive sputtering in a nitrogen and oxygen-containing atmosphere using a V—Al alloy sputtering target.

6 Claims, 6 Drawing Sheets

(51) Int. Cl.
*G01K 7/22* (2006.01)
*H01C 7/04* (2006.01)
*H01C 17/12* (2006.01)
*C23C 14/00* (2006.01)
*C23C 14/06* (2006.01)
*C23C 14/14* (2006.01)
*H01C 1/14* (2006.01)
*H01J 37/34* (2006.01)
*C30B 29/38* (2006.01)

(52) U.S. Cl.
CPC .............. *C23C 14/14* (2013.01); *G01K 7/22* (2013.01); *H01C 1/14* (2013.01); *H01C 7/006* (2013.01); *H01C 7/04* (2013.01); *H01C 17/12* (2013.01); *H01J 37/3429* (2013.01); *C30B 29/38* (2013.01)

(58) Field of Classification Search
USPC .................................................. 338/22 R, 13
See application file for complete search history.

(56) References Cited

U.S. PATENT DOCUMENTS

| | | | |
|---|---|---|---|
| 2010/0104495 A1* | 4/2010 | Kawabata | ................ C30B 7/10 |
| | | | 423/409 |
| 2014/0193623 A1* | 7/2014 | Setoyama | ............... B23B 27/14 |
| | | | 428/216 |

FOREIGN PATENT DOCUMENTS

| | | |
|---|---|---|
| JP | 06-158272 A | 6/1994 |
| JP | 10-270201 A | 10/1998 |
| JP | 2000-068110 A | 3/2000 |
| JP | 2000-348903 A | 12/2000 |
| JP | 2004-319737 A | 11/2004 |
| JP | 2006-324520 A | 11/2006 |
| JP | 2008-251611 A | 10/2008 |

\* cited by examiner

[Fig. 1]
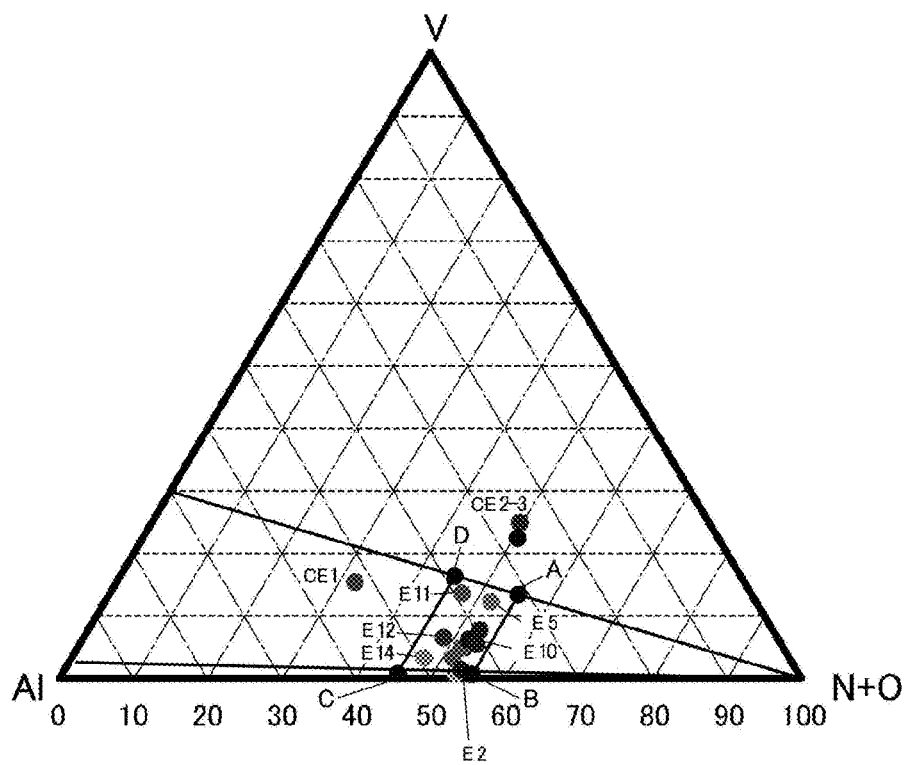
[Fig. 2]
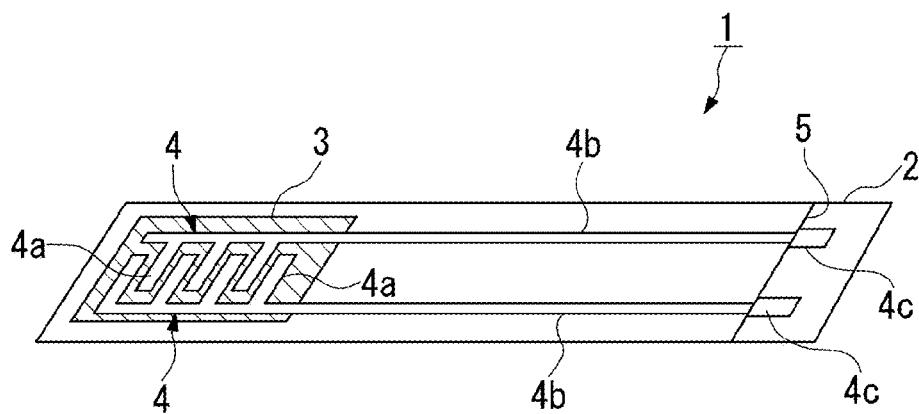

[Fig. 3]
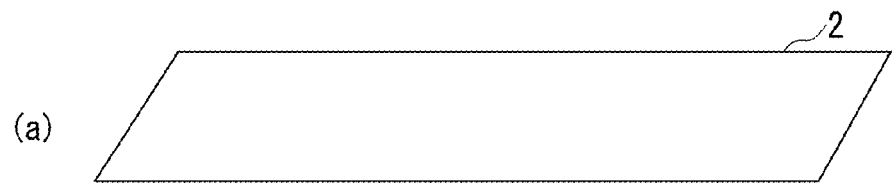
(a)
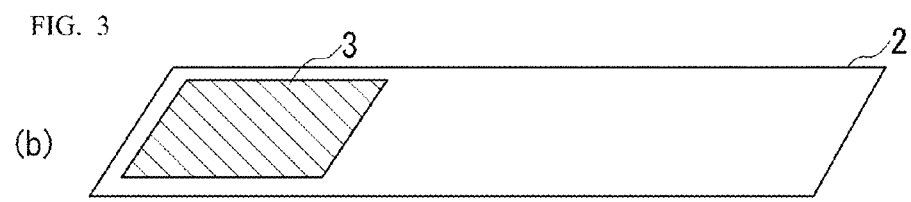
FIG. 3
(b)
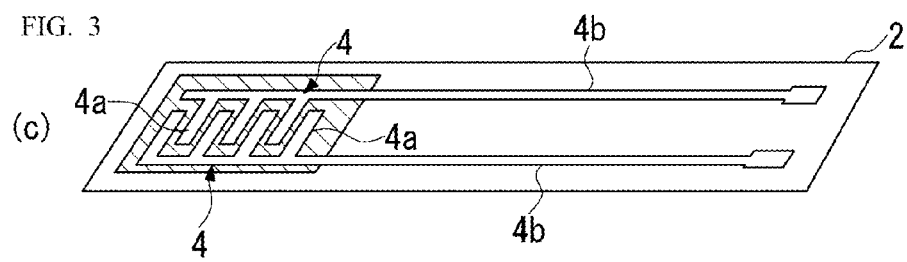
FIG. 3
(c)
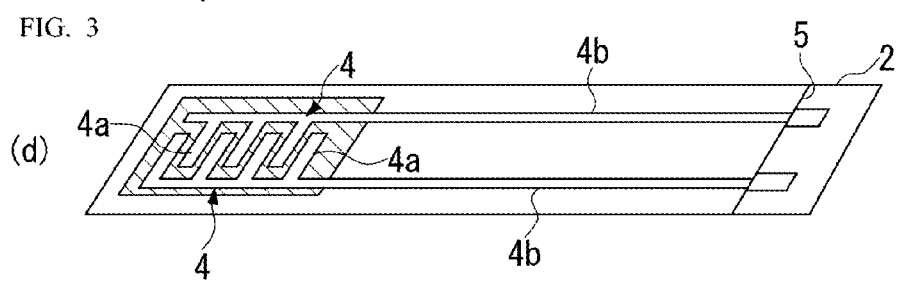
FIG. 3
(d)
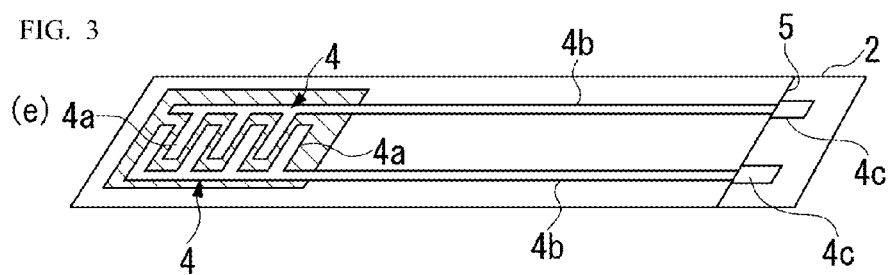
FIG. 3
(e)

[Fig. 4]
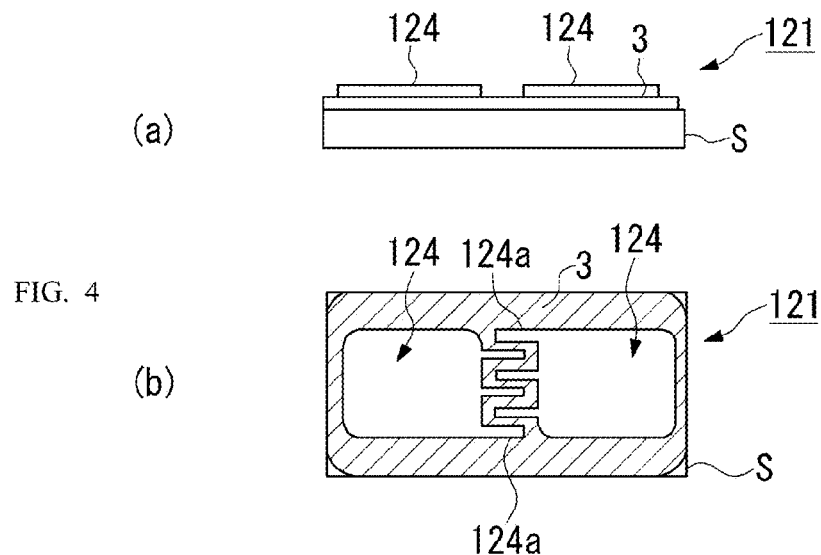
FIG. 4
[Fig. 5]
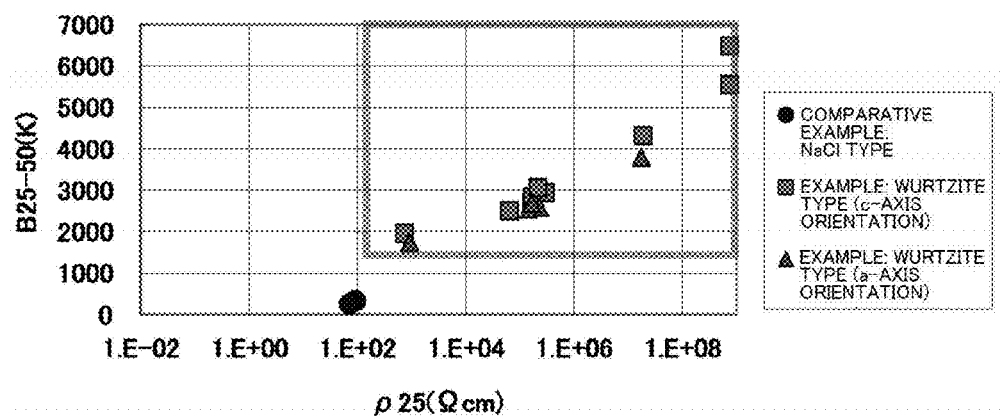

[Fig. 6]
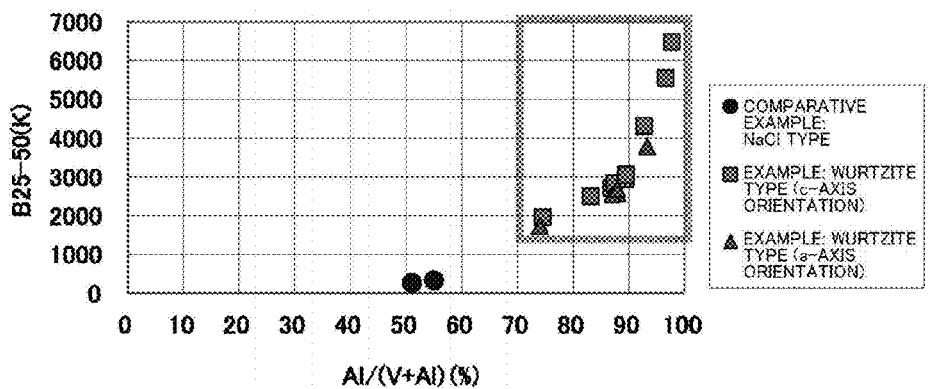
[Fig. 7]
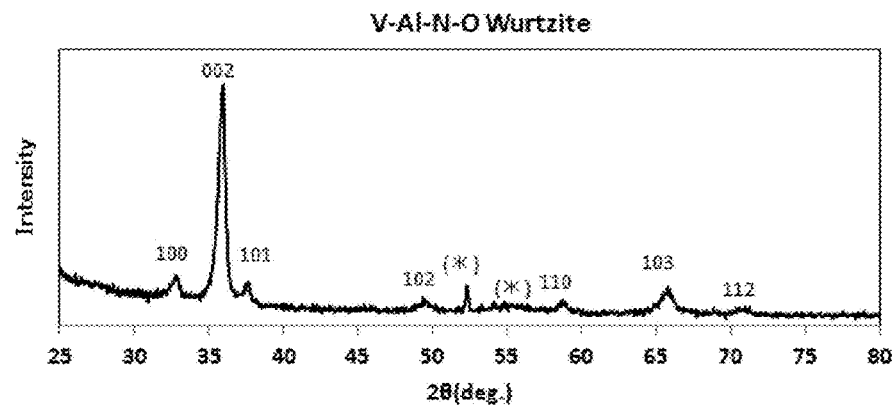
[Fig. 8]
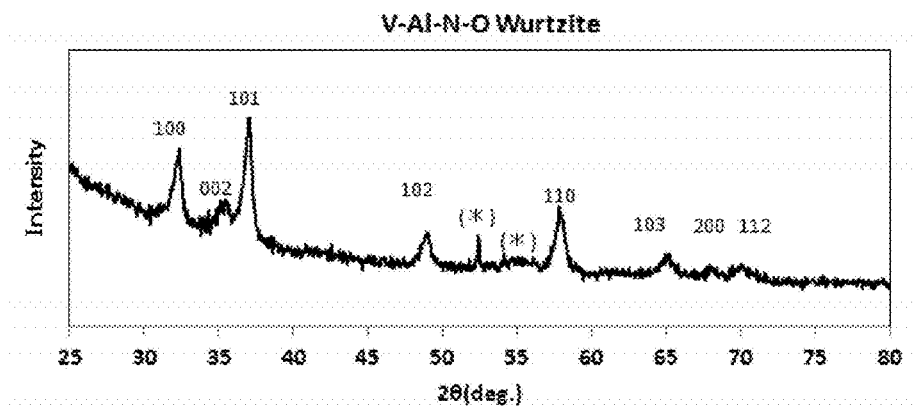

[Fig. 9]
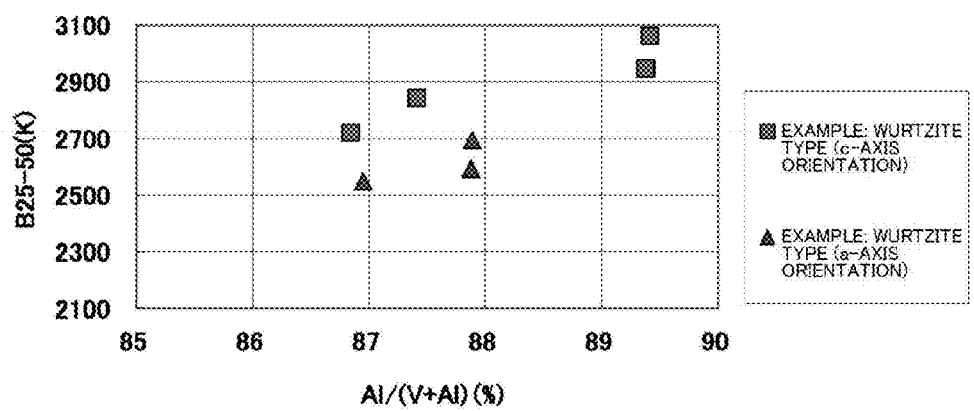
[Fig. 10]
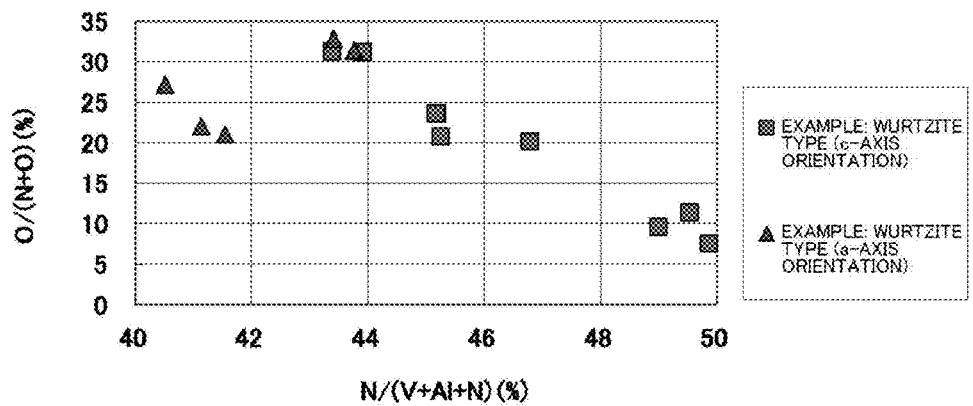

[Fig. 11]
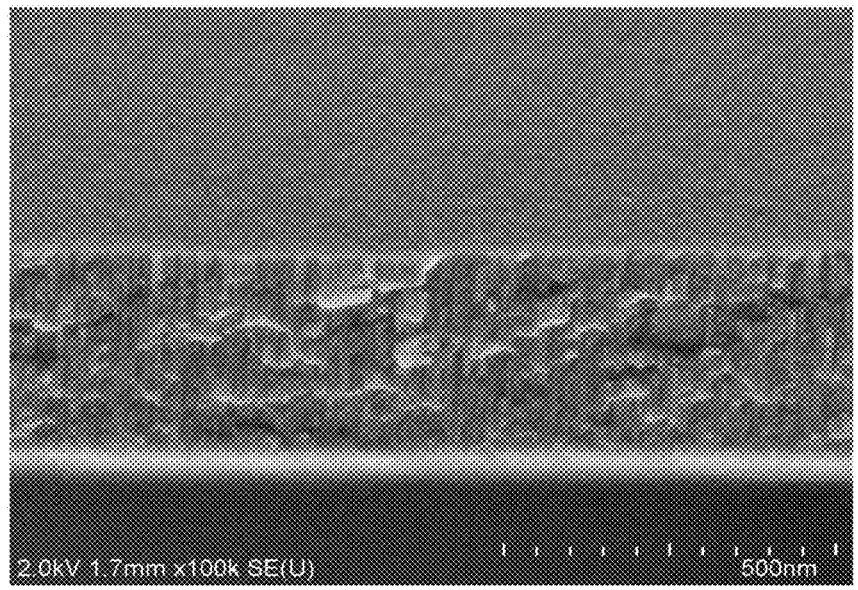
[Fig. 12]
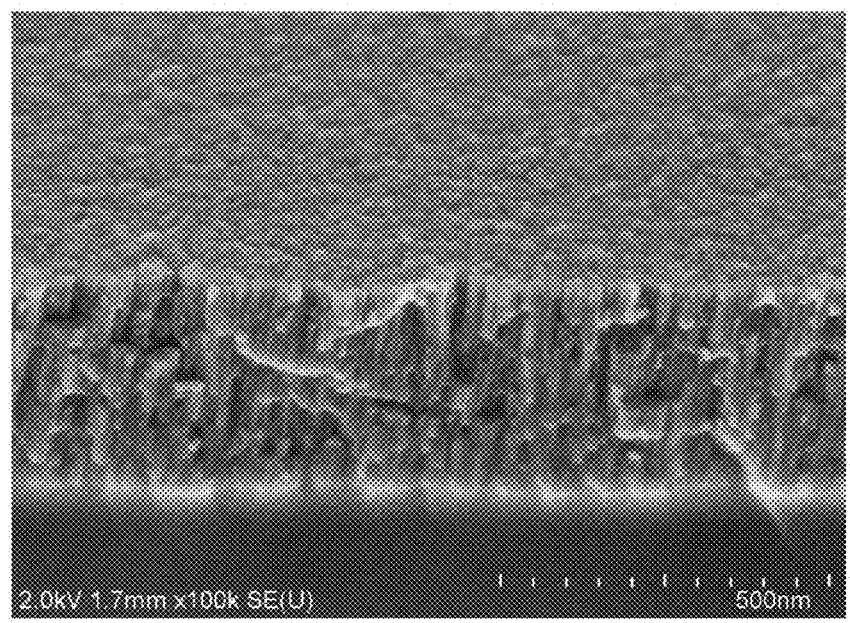

20

METAL NITRIDE MATERIAL FOR THERMISTOR, METHOD FOR PRODUCING SAME, AND FILM TYPE THERMISTOR SENSOR

CROSS REFERENCE TO RELATED APPLICATIONS

This application is related to two co-pending applications: "METAL NITRIDE MATERIAL FOR THERMISTOR, METHOD FOR PRODUCING SAME, AND FILM TYPE THERMISTOR SENSOR" filed even date herewith in the names of Toshiaki FUJITA, Hiroshi TANAKA and Noriaki NAGATOMO as a national phase entry of PCT/JP2014/064558; and "METAL NITRIDE MATERIAL FOR THERMISTOR, METHOD FOR PRODUCING SAME, AND FILM TYPE THERMISTOR SENSOR" filed even date herewith in the names of Toshiaki FUJITA, Hiroshi TANAKA and Noriaki NAGATOMO as a national phase entry of PCT/JP2014/064894; which applications are assigned to the assignee of the present application and all incorporated by reference herein.

BACKGROUND OF THE INVENTION

Field of the Invention

The present invention relates to a metal nitride material for a thermistor, which can be directly deposited on a film or the like without firing, a method for producing the same, and a film type thermistor sensor.

Description of the Related Art

There is a demand for a thermistor material used for a temperature sensor or the like having a high B constant in order to obtain a high precision and high sensitivity thermistor sensor. Conventionally, transition metal oxides of Mn, Co, Fe, and the like are typically used as such thermistor materials (see Patent Documents 1 to 3). These thermistor materials need a heat treatment such as firing at a temperature of 550° C. or higher in order to obtain a stable thermistor characteristic/property.

In addition to thermistor materials consisting of metal oxides as described above, Patent Document 4 discloses a thermistor material consisting of a nitride represented by the general formula: $M_xA_yN_z$ (where "M" represents at least one of Ta, Nb, Cr, Ti, and Zr, "A" represents at least one of Al, Si, and B, $0.1 \leq x \leq 0.8$, $0 < y \leq 0.6$, $0.1 \leq z \leq 0.8$, and $x+y+z=1$). In Patent Document 4, only a Ta—Al—N-based material consisting of a nitride represented by the general formula: $M_xA_yN_z$ (where $0.5 \leq x \leq 0.8$, $0.1 \leq y \leq 0.5$, $0.2 \leq z \leq 0.7$, and $x+y+z=1$) is described in an Example. The Ta—Al—N-based material is produced by sputtering in a nitrogen gas-containing atmosphere using a material containing the element(s) listed above as a target. The resultant thin film is subject to a heat treatment at a temperature from 350 to 600° C. as required.

Other than thermistor materials, Patent document 5 discloses a resistance film material for a strain sensor, which consists of a nitride represented by the general formula: $Cr_{100-x-y}N_xM_y$ (where "M" is one or more elements selected from Ti, V, Nb, Ta, Ni, Zr, Hf, Si, Ge, C, O, P, Se, Te, Zn, Cu, Bi, Fe, Mo, W, As, Sn, Sb, Pb, B, Ga, In, Tl, Ru, Rh, Re, Os, Ir, Pt, Pd, Ag, Au, Co, Be, Mg, Ca, Sr, Ba, Mn, Al, and rare earth elements, the crystal structure thereof is composed of mainly a bcc structure or mainly a mixed structure of a bcc structure and A15 type structure, $0.0001 \leq x \leq 30$, $0 \leq y \leq 30$, and $0.0001 \leq x+y \leq 50$). The resistance film material for a strain sensor is employed for measuring strain and stress from changes in the resistance of the sensor made of a Cr—N-based strain resistance film, where both of the amounts of nitrogen (x) and an accessory component element(s) M (y) are 30 at % or lower, as well as for performing various conversions. The Cr—N-M-based material is produced by reactive sputtering in a deposition atmosphere containing the accessory gaseous element(s) using a material containing the above-described element(s) or the like as a target. The resultant thin film is subject to a heat treatment at a temperature from 200 to 1000° C. as required.

PRIOR ART DOCUMENTS

Patent Documents

[Patent Document 1] Japanese Unexamined Patent Application Publication No. 2000-068110
[Patent Document 2] Japanese Unexamined Patent Application Publication No. 2000-348903
[Patent Document 3] Japanese Unexamined Patent Application Publication No. 2006-324520
[Patent Document 4] Japanese Unexamined Patent Application Publication No. 2004-319737
[Patent Document 5] Japanese Unexamined Patent Application Publication No. H10-270201

SUMMARY OF THE INVENTION

Problems to be Solved by the Invention

The following problems still remain in the conventional techniques described above.

In recent years, the development of a film type thermistor sensor made of a thermistor material formed on a resin film has been considered, and thus, it has been desired to develop a thermistor material that can be directly deposited on a film. Specifically, it is expected that a flexible thermistor sensor will be obtained by using a film. Furthermore, it is desired to develop a very thin thermistor sensor having a thickness of about 0.1 mm. Although a substrate material including a ceramic such as alumina has often been conventionally used, there is a problem that if this substrate material is thinned to a thickness of 0.1 mm for example, it is very fragile and breaks easily. Therefore, it is expected that a very thin thermistor sensor will be obtained by using a film.

However, a film made of a resin material typically has a low heat resistance temperature of 150° C. or lower, and even polyimide, which is known as a material having a relatively high heat resistance temperature, only has a heat resistance temperature of about 200° C. Hence, when a heat treatment is performed in a process of forming a thermistor material, it has been conventionally difficult to apply such a resin material. Since the above-described conventional oxide thermistor material needs to be fired at a temperature of 550° C. or higher in order to realize a desired thermistor characteristic, a film type thermistor sensor in which the thermistor material is directly deposited on a film cannot be realized. Therefore, it has been desired to develop a thermistor material that can be directly deposited on a film without firing. However, even the thermistor material disclosed in Patent Document 4 still needs a heat treatment on the resultant thin film at a temperature from 350 to 600° C. as required in order to obtain a desired thermistor characteristic. Regarding this thermistor material, a B constant of about 500 to 3000 K was obtained in an Example of the Ta—Al—N-based material, but the heat resistance of this material is not described and therefore, the thermal reliability of a nitride-based material is unknown.

In addition, since the Cr—N-M-based material disclosed in Patent document 5 has a low B constant of 500 or lower and cannot ensure heat resistance to a temperature of 200° C. or lower unless a heat treatment in the range of 200° C. to 1000° C. is performed, a film type thermistor sensor in which the thermistor material is directly deposited on a film cannot be realized. Therefore, it has been desired to develop a thermistor material that can be directly deposited on a film without firing.

The present invention has been made in view of the aforementioned circumstances, and an object of the present invention is to provide a metal nitride material for a thermistor, which has a high heat resistance and a high reliability and can be directly deposited on a film or the like without firing, a method for producing the same, and a film type thermistor sensor.

Means for Solving the Problems

The present inventors' serious endeavor carried out by focusing on an Al—N-based material among nitride materials found that the Al—N-based material having a good B constant and an excellent heat resistance may be obtained without firing by substituting the Al site with a specific metal element for improving electric conductivity and by forming it into a specific crystal structure even though Al—N is an insulator and difficult to provide with an optimum thermistor characteristic (B constant: about 1000 to 6000 K).

Therefore, the present invention has been made on the basis of the above finding, and adopts the following configuration in order to overcome the aforementioned problems.

Specifically, a metal nitride material for a thermistor according to a first aspect of the present invention is characterized by a metal nitride material used for a thermistor, which consists of a metal nitride represented by the general formula: $V_xAl_y(N_{1-w}O_w)_z$ (where $0.70 \leq y/(x+y) \leq 0.98$, $0.45 \leq z \leq 0.55$, $0 < w \leq 0.35$, and $x+y+z=1$), wherein the crystal structure thereof is a hexagonal wurtzite-type single phase.

Since this metal nitride material for a thermistor consists of a metal nitride represented by the general formula: $V_xAl_y(N_{1-w}O_w)_z$ (where $0.70 \leq y/(x+y) \leq 0.98$, $0.45 \leq z \leq 0.55$, $0 < w \leq 0.35$, and $x+y+z=1$), wherein the crystal structure thereof is a hexagonal wurtzite-type single phase, a good B constant and an high heat resistance can be obtained without firing. In particular, the heat resistance can be further improved by the effect of oxygen (O) included in a crystal so as to compensate nitrogen defects in the crystal or to introduce interstitial oxygen therein, or the like.

Note that, when the value of "$y/(x+y)$" (i.e., $Al/(V+Al)$) is less than 0.70, a wurtzite-type single phase cannot be obtained, but two coexisting crystal phases of a wurtzite-type phase and a NaCl-type phase or a crystal phase of only a NaCl-type phase may be obtained, so that a sufficiently high resistance and a high B constant cannot be obtained.

When the value of "$y/(x+y)$" (i.e., $Al/(V+Al)$) exceeds 0.98, the metal nitride material exhibits very high resistivity and extremely high electrical insulation, so that the metal nitride material is not applicable as a thermistor material.

When the value of "z" (i.e., $(N+O)/(V+Al+N+O)$) is less than 0.45, the nitridation amount is too small to obtain a wurtzite-type single phase. Consequently, a sufficiently high resistance and a high B constant cannot be obtained.

In addition, when the value of "z" (i.e., $(N+O)/(V+Al+N+O)$) exceeds 0.55, a wurtzite-type single phase cannot be obtained. This is because the stoichiometric ratio in the absence of defects at the nitrogen site in a wurtzite-type single phase is 0.5 (i.e., $N/(V+Al+N)=0.5$), and because the stoichiometric ratio when all defects at the nitrogen site are compensated by oxygen is 0.5 (i.e., $(N+O)/(V+Al+N+O)=0.5$). The amount of "z" exceeding 0.5 may be due to the interstitial oxygen introduced in a crystal or due to the quantitative accuracy of the light elements (nitrogen, oxygen) in an XPS analysis.

Further, in this study, when the value of "w" (i.e., $O/(N+O)$) exceeds 0.35, a wurtzite-type single phase can not be obtained. The reason will be understandable considering the fact that a corundum-type $V_2O_3$ phase is formed in the case where $w=1$ and $y/(x+y)=0$ and a corundum-type $Al_2O_3$ phase is formed in the case where $w=1$ and $y/(x+y)=1$. It has been found in this study that when the value of "w" increases, that is, the amount of oxygen increases with respect to the amount of nitrogen, it is difficult to obtain a wurtzite-type single phase, and hence, a wurtzite-type single phase can be obtained only when $O/(N+O)$ is 0.35 or less.

A metal nitride material for a thermistor according to a second aspect of the present invention is characterized in that the metal nitride material for a thermistor according to the first aspect of the present invention is deposited as a film, and is a columnar crystal extending in a vertical direction with respect to the surface of the film.

Specifically, since this metal nitride material for a thermistor is a columnar crystal extending in a vertical direction with respect to the surface of the film, the crystallinity of the film is high, so that a high heat resistance can be obtained.

A metal nitride material for a thermistor according to a third aspect of the present invention is characterized in that the metal nitride material according to the first or second aspect of the present invention is deposited as a film and is more strongly oriented along the c-axis than the a-axis in a vertical direction with respect to the surface of the film.

Specifically, since this metal nitride material for a thermistor is more strongly oriented along the c-axis than the a-axis in a vertical direction with respect to the surface of the film, a high B constant and further an excellent reliability in heat resistance can be obtained as compared with the case of a strong a-axis orientation.

A film type thermistor sensor according to a fourth aspect of the present invention is characterized by including an insulating film; a thin film thermistor portion made of the metal nitride material for a thermistor according to any one of the first to third aspects of the present invention formed on the insulating film; and a pair of pattern electrodes formed at least on the top or the bottom of the thin film thermistor portion.

Specifically, since the thin film thermistor portion made of the metal nitride material for a thermistor according to any one of the first to third aspects of the present invention is formed on the insulating film in this film type thermistor sensor, an insulating film having a low heat resistance such as a resin film can be used because the thin film thermistor portion is formed without firing and has a high B constant and a high heat resistance, so that a thin and flexible thermistor sensor having an excellent thermistor characteristic can be obtained.

A substrate material including a ceramic such as alumina that has often been conventionally used has the problem that if this substrate material is thinned to a thickness of 0.1 mm for example, it is very fragile and breaks easily. On the other hand, since a film can be used in the present invention, a very thin film type thermistor sensor having a thickness of 0.1 mm, for example, can be obtained.

A method for producing a metal nitride material for a thermistor according to a fifth aspect of the present invention is characterized in that the method for producing the metal nitride material for a thermistor according to any one of the first to third aspects of the present invention includes a deposition step of performing film deposition by reactive sputtering in a nitrogen and oxygen-containing atmosphere using a V—Al alloy sputtering target.

Specifically, since the film deposition is performed by reactive sputtering in a nitrogen and oxygen-containing atmosphere using a V—Al alloy sputtering target in this method for producing the metal nitride material for a thermistor, the metal nitride material for a thermistor of the present invention, which consists of the aforementioned $V_xAl_y(N, O)_z$, can be deposited on a film without firing.

A method for producing a metal nitride material for a thermistor according to a sixth aspect of the present invention is characterized by the method according to the fifth aspect of the present invention, wherein the sputtering gas pressure during the reactive sputtering is set to less than 0.7 Pa.

Specifically, since the sputtering gas pressure during the reactive sputtering is set to less than 0.7 Pa in this method for producing a metal nitride material for a thermistor, the film made of the metal nitride material for a thermistor according to the third aspect of the present invention, which is more strongly oriented along the c-axis than the a-axis in a vertical direction to the surface of the film, can be formed.

Effects of the Invention

According to the present invention, the following effects may be provided.

Specifically, since the metal nitride material for a thermistor according to the present invention consists of a metal nitride represented by the general formula: $V_xAl_y(N_{1-w}O_w)_z$ (where $0.70 \leq y/(x+y) \leq 0.98$, $0.45 \leq z \leq 0.55$, $0 < w \leq 0.35$, and $x+y+z=1$), wherein the crystal structure thereof is a hexagonal wurtzite-type single phase, the metal nitride material having a good B constant and an high heat resistance can be obtained without firing. Also, since film deposition is performed by reactive sputtering in a nitrogen and oxygen-containing atmosphere using a V—Al alloy sputtering target in the method for producing the metal nitride material for a thermistor according to the present invention, the metal nitride material for a thermistor of the present invention, which consists of the $V_xAl_y(N,O)_z$ described above, can be deposited on a film without firing. Further, since a thin film thermistor portion made of the metal nitride material for a thermistor according to the present invention is formed on an insulating film in the film type thermistor sensor according to the present invention, a thin and flexible thermistor sensor having an excellent thermistor characteristic can be obtained by using an insulating film such as a resin film having a low heat resistance. Furthermore, since the substrate material is a resin film rather than a ceramic that becomes very fragile and breaks easily when being thinned, a very thin film type thermistor sensor having a thickness of 0.1 mm can be obtained.

BRIEF DESCRIPTION OF THE DRAWINGS

FIG. 1 is a V—Al—(N+0)-based ternary phase diagram illustrating the composition range of a metal nitride material for a thermistor according to one embodiment of a metal nitride material for a thermistor, a method for producing the same, and a film type thermistor sensor of the present invention.

FIG. 2 is a perspective view illustrating a film type thermistor sensor according to the present embodiment.

FIGS. 3(*a*)-3(*e*) are perspective views illustrating a method for producing a film type thermistor sensor in the order of the steps according to the present embodiment.

FIGS. 4(*a*)-4(*b*) are a front view and a plan view respectively illustrating a film evaluation element of a metal nitride material for a thermistor according to an Example of a metal nitride material for a thermistor, a method for producing the same, and a film type thermistor sensor of the present invention.

FIG. 5 is a graph illustrating the relationship between a resistivity at 25° C. and a B constant according to Examples and Comparative Examples of the present invention.

FIG. 6 is a graph illustrating the relationship between a Al/(V+Al) ratio and a B constant according to Examples and Comparative Examples of the present invention.

FIG. 7 is a graph illustrating the result of X-ray diffraction (XRD) in the case of a strong c-axis orientation according to the Example of the present invention where Al/(V+Al) = 0.87.

FIG. 8 is a graph illustrating the result of X-ray diffraction (XRD) in the case of a strong a-axis orientation according to the Example of the present invention where Al/(V+Al) = 0.88.

FIG. 9 is a graph illustrating the relationship between a Al/(V+Al) ratio and a B constant for comparison of materials exhibiting a strong a-axis orientation and materials exhibiting a strong c-axis orientation according to Examples of the present invention.

FIG. 10 is a graph illustrating the relationship between an N/(V+Al+N) ratio and an O(N+0) ratio for comparison of materials exhibiting a strong a-axis orientation and materials exhibiting a strong c-axis orientation according to Examples of the present invention.

FIG. 11 is a cross-sectional SEM photograph illustrating a material exhibiting a strong c-axis orientation according to an Example of the present invention.

FIG. 12 is a cross-sectional SEM photograph illustrating a material exhibiting a strong a-axis orientation according to an Example of the present invention.

DESCRIPTION OF THE EMBODIMENTS

Hereinafter, a description will be given of a metal nitride material for a thermistor, a method for producing the same, and a film type thermistor sensor according to one embodiment of the present invention with reference to FIGS. 1, 2 and 3(*a*)-3(*e*). In the drawings used in the following description, the scale of each component is changed as appropriate so that each component is recognizable or is readily recognized.

The metal nitride material for a thermistor of the present embodiment is a metal nitride material used for a thermistor, which consists of a metal nitride represented by the general formula: $V_xAl_y(N_{1-w}O_w)_z$ (where $0.70 \leq y/(x+y) \leq 0.98$, $0.45 \leq z \leq 0.55$, $0 < w \leq 0.35$, and $x+y+z=1$), wherein the crystal structure thereof is a hexagonal wurtzite-type (space group: P6$_3$mc (No. 186)) single phase. Specifically, this metal nitride material for a thermistor consists of a metal nitride having a composition within the region enclosed by the points A, B, C, and D in the V (vanadium)-Al—(N+O)-based ternary phase diagram as shown in FIG. 1, wherein the crystal phase thereof is a wurtzite-type.

Note that the composition ratios of (x, y, z) (at %) at the points A, B, C, and D are A (x, y, z=13.5, 31.5, 55.0), B (x, y, z=0.9, 44.1, 55.0), C (x, y, z=1.1, 53.9, 45.0), and D (x, y, z=16.5, 38.5, 45.0), respectively.

Also, this metal nitride material for a thermistor is deposited as a film, and is a columnar crystal extending in a vertical direction with respect to the surface of the film. Furthermore, it is preferable that the metal nitride material for a thermistor is more strongly oriented along the c-axis than the a-axis in a vertical direction with respect to the surface of the film.

The decision about whether a metal nitride material for a thermistor has a strong a-axis orientation (100) or a strong c-axis orientation (002) in a vertical direction (film thickness direction) with respect to the surface of the film is made by examining the orientation of the crystal axis using X-ray diffraction (XRD). When the peak intensity ratio of "the peak intensity of (100)"/"the peak intensity of (002)", where (100) is the hkl index indicating a-axis orientation and (002) is the hkl index indicating c-axis orientation, is less than 1, the metal nitride material for a thermistor is determined to have a strong c-axis orientation.

Next, a description will be given of a film type thermistor sensor using the metal nitride material for a thermistor of the present embodiment. As shown in FIG. 2, a film type thermistor sensor 1 includes an insulating film 2, a thin film thermistor portion 3 made of the metal nitride material for a thermistor described above formed on the insulating film 2, and a pair of pattern electrodes 4 formed at least on the top of the thin film thermistor portion 3.

The insulating film 2 is, for example, a polyimide resin sheet formed in a band shape. The insulating film 2 may be made of another material such as polyethylene terephthalate (PET), polyethylene naphthalate (PEN), or the like.

The pair of pattern electrodes 4 has a pair of comb shaped electrode portions 4a that is patterned so as to have a comb shaped pattern by using stacked metal films of, for example, a Cr film and an Au film and is arranged opposite to each other on the thin film thermistor portion 3, and a pair of linear extending portions 4b extending with the tip ends thereof being connected to these comb shaped electrode portions 4a and the base ends thereof being arranged at the end of the insulating film 2.

A plating portion 4c such as Au plating is formed as a lead wire drawing portion on the base end of each of the pair of linear extending portions 4b. One end of the lead wire is joined with the plating portion 4c via a solder material or the like. Furthermore, except for the end of the insulating film 2 including the plating portions 4c, a polyimide coverlay film 5 is pressure bonded onto the insulating film 2. Instead of the polyimide coverlay film 5, a polyimide or epoxy-based resin material layer may be formed onto the insulating film 2 by printing.

A description will be given below of a method for producing the metal nitride material for a thermistor and a method for producing the film type thermistor sensor 1 using the metal nitride material for a thermistor with reference to FIGS. 3(a)-3(e).

The method for producing the metal nitride material for a thermistor according to the present embodiment includes a deposition step of performing film deposition by reactive sputtering in a nitrogen and oxygen-containing atmosphere using a V—Al alloy sputtering target.

It is preferable that the sputtering gas pressure during the reactive sputtering is set to less than 0.7 Pa.

Furthermore, it is preferable that the deposited film is irradiated with nitrogen plasma after the deposition step.

More specifically, the thin film thermistor portion 3 having a thickness of 200 nm, which is made of the metal nitride material for a thermistor of the present embodiment, is deposited on the insulating film 2 which is, for example, a polyimide film having a thickness of 50 μm shown in FIG. 3(a) by the reactive sputtering method, as shown in FIG. 3(b). The exemplary sputtering conditions at this time are as follows: an ultimate vacuum: $5 \times 10^{-6}$ Pa, a sputtering gas pressure: 0.6 Pa, a target input power (output): 300 W, and a nitrogen gas partial pressure and an oxygen gas partial pressure under a mixed gas (Ar gas+nitrogen gas+oxygen gas) atmosphere: 59.8% and 0.2%, respectively. In addition, the metal nitride material for a thermistor having a desired size is deposited on the insulating film 2 using a metal mask so as to form the thin film thermistor portion 3. It is preferable that the formed thin film thermistor portion 3 is irradiated with nitrogen plasma. For example, the thin film thermistor portion 3 is irradiated with nitrogen plasma under the degree of vacuum of 6.7 Pa, the output of 200 W, and the $N_2$ gas atmosphere.

Next, a Cr film having a thickness of 20 nm is formed and an Au film having a thickness of 200 nm is further formed thereon by the sputtering method, for example. Furthermore, patterning is performed as follows: after a resist solution has been coated on the stacked metal films using a barcoater, pre-baking is performed for 1.5 minutes at a temperature of 110° C.; after the exposure by an exposure device, any unnecessary portions are removed by a developing solution, and then post-baking is performed for 5 minutes at a temperature of 150° C. Then, any unnecessary electrode portions are subject to wet etching using commercially available Au etchant and Cr etchant, and then the resist is stripped so as to form the pair of pattern electrodes 4 each having a desired comb shaped electrode portion 4a as shown in FIG. 3(c). Note that the pair of pattern electrodes 4 may be formed in advance on the insulating film 2, and then the thin film thermistor portion 3 may be deposited on the comb shaped electrode portions 4a. In this case, the comb shaped electrode portions 4a of the pair of pattern electrodes 4 are formed on the bottom of the thin film thermistor portion 3.

Next, as shown in FIG. 3(d), the polyimide coverlay film 5 with an adhesive having a thickness of 50 μm, for example, is placed on the insulating film 2, and then they are bonded to each other under pressurization of 2 MPa at a temperature of 150° C. for 10 minutes using a press machine. Furthermore, as shown in FIG. 3(e), an Au thin film having a thickness of 2 μm is formed at the base ends of the linear extending portions 4b using, for example, an Au plating solution so as to form the plating portions 4c.

When a plurality of film type thermistor sensors 1 is simultaneously produced, a plurality of thin film thermistor portions 3 and a plurality of pattern electrodes 4 are formed on a large-format sheet of the insulating film 2 as described above, and then, the resulting large-format sheet is cut into a plurality of segments so as to obtain a plurality of film type thermistor sensors 1.

In this manner, a thin film type thermistor sensor 1 having a size of 25×3.6 mm and a thickness of 0.1 mm, for example, is obtained.

As described above, since the metal nitride material for a thermistor of the present embodiment consists of a metal nitride represented by the general formula: $V_xAl_y(N_{1-w}O_w)_z$ (where $0.70 \leq y/(x+y) \leq 0.98$, $0.45 \leq z \leq 0.55$, $0 < w \leq 0.35$, and $x+y+z=1$), wherein the crystal structure thereof is a hexagonal wurtzite-type (space group: $P6_3mc$ (No. 186)) single phase, a good B constant and a high heat resistance can be obtained without firing. In particular, the heat resistance can be further improved by the effect of oxygen (O) included in a crystal so as to compensate nitrogen defects in the crystal or the like.

Since this metal nitride material for a thermistor is a columnar crystal extending in a vertical direction with respect to the surface of the film, the crystallinity of the film is high, so that a high heat resistance can be obtained.

Furthermore, since this metal nitride material for a thermistor is more strongly oriented along the c-axis than the a-axis in a vertical direction with respect to the surface of the film, a high B constant as compared with the case of a strong a-axis orientation can be obtained.

Since film deposition is performed by reactive sputtering in a nitrogen and oxygen-containing atmosphere using a V—Al alloy sputtering target in the method for producing the metal nitride material for a thermistor of the present embodiment, the metal nitride material for a thermistor, which consists of the $V_xAl_y(N,O)_z$ described above, can be deposited on a film without firing.

In addition, when the sputtering gas pressure during the reactive sputtering is set to less than 0.7 Pa, a film made of the metal nitride material for a thermistor, which is more strongly oriented along the c-axis than the a-axis in a vertical direction to the surface of the film, can be formed.

Thus, since the thin film thermistor portion 3 made of the metal nitride material for a thermistor described above is formed on the insulating film 2 in the film type thermistor sensor 1 using the metal nitride material for a thermistor of the present embodiment, the insulating film 2 having a low heat resistance, such as a resin film, can be used because the thin film thermistor portion 3 is formed without firing and has a high B constant and a high heat resistance, so that a thin and flexible thermistor sensor having an excellent thermistor characteristic can be obtained.

A substrate material including a ceramic such as alumina that has often been conventionally used has the problem that if this substrate material is thinned to a thickness of 0.1 mm, for example, it is very fragile and breaks easily. On the other hand, since a film can be used in the present embodiment, a very thin film type thermistor sensor having a thickness of 0.1 mm, for example, can be provided.

EXAMPLES

Next, the evaluation results of the materials according to Examples produced based on the above embodiment regarding the metal nitride material for a thermistor, the method for producing the same, and the film type thermistor sensor according to the present invention will be specifically described with reference to FIGS. 4(a)-4(b) to 12.

<Production of Film Evaluation Element>

The film evaluation elements 121 shown in FIGS. 4(a) and 4(b) were produced according to Examples and Comparative Examples of the present invention as follows.

Firstly, each of the thin film thermistor portions 3 having a thickness of 500 nm which were made of the metal nitride materials for a thermistor with the various composition ratios shown in Table 1 was formed on an Si wafer with a thermal oxidation film as an Si substrate (S) by using a V—Al alloy target with various composition ratios by the reactive sputtering method. The thin film thermistor portions 3 were formed under the sputtering conditions of an ultimate vacuum of $5\times10^{-6}$ Pa, a sputtering gas pressure of from 0.1 to 1 Pa, a target input power (output) of from 100 to 500 W, and a nitrogen gas partial pressure and an oxygen gas partial pressure under a mixed gas (Ar gas+nitrogen gas+oxygen gas) atmosphere of from 10 to 100% and 0 to 3%, respectively.

Next, a Cr film having a thickness of 20 nm was formed and an Au film having a thickness of 200 nm was further formed on each of the thin film thermistor portions 3 by the sputtering method. Furthermore, patterning was performed as follows: after a resist solution had been coated on the stacked metal films using a spin coater, pre-baking was performed for 1.5 minutes at a temperature of 110° C.; after the exposure by an exposure device, any unnecessary portions were removed by a developing solution, and then post-baking was performed for 5 minutes at a temperature of 150° C. Then, any unnecessary electrode portions were subject to wet etching using commercially available Au etchant and Cr etchant, and then the resist was stripped so as to form a pair of pattern electrodes 124, each having a desired comb shaped electrode portion 124a. Then, the resultant elements were diced into chip elements so as to obtain the film evaluation elements 121 used for evaluating a B constant and for testing heat resistance.

In addition, the film evaluation elements 121 according to Comparative Examples, each having the composition ratio of $V_xAl_y(N,O)_z$ outside the range of the present invention and a different crystal system, were similarly produced for comparative evaluation.

<Film Evaluation>

(1) Composition Analysis

Elemental analysis was performed by X-ray photoelectron spectroscopy (XPS) on the thin film thermistor portions 3 obtained by the reactive sputtering method. In the XPS, a quantitative analysis was performed on a sputtering surface at a depth of 20 nm from the outermost surface by Ar sputtering. The results are shown in Table 1. In the following table, the composition ratios are expressed by "at %". Some of the samples were also subject to a quantitative analysis on a sputtering surface at a depth of 100 nm from the outermost surface to confirm that it had the same composition within the quantitative accuracy as that of the sputtering surface at a depth of 20 nm.

In the X-ray photoelectron spectroscopy (XPS), a quantitative analysis was performed under the conditions of an X-ray source of MgKα (350 W), a path energy of 58.5 eV, a measurement interval of 0.125 eV, a photo-electron take-off angle with respect to a sample surface of 45 deg, and an analysis area of about 800 μmφ. Note that the quantitative accuracy of N/(V+Al+N+O) and O/(V+Al+N+O) were ±2% and that of Al/(V+Al) was ±1%.

(2) Specific Resistance Measurement

The specific resistance of each of the thin film thermistor portions 3 obtained by the reactive sputtering method was measured by the four-probe method at a temperature of 25° C. The results are shown in Table 1.

(3) Measurement of B Constant

The resistance values for each of the film evaluation elements 121 at temperatures of 25° C. and 50° C. were measured in a constant temperature bath, and a B constant was calculated based on the resistance values at temperatures of 25° C. and 50° C. The results are shown in Table 1. In addition, it was confirmed that the film evaluation elements 121 were thermistors having a negative temperature characteristic based on the resistance values at temperatures of 25° C. and 50° C.

In the present invention, a B constant is calculated by the following formula using the resistance values at temperatures of 25° C. and 50° C.

B constant $(K) = ln(R25/R50)/(1/T25 - 1/T50)$

R25 (Ω): resistance value at 25° C.
R50 (Ω): resistance value at 50° C.
T25 (K): 298.15 K, which is an absolute temperature of 25° C. expressed in Kelvin
T50 (K): 323.15 K, which is an absolute temperature of 50° C. expressed in Kelvin As can be seen from these results, thermistor characteristics including a resistivity of 100 Ωcm or higher and a B constant of 1500 K or higher are achieved in all of the Examples in which the composition ratios of $V_xAl_y(N,O)_z$ fall within the region enclosed by the points A, B, C, and D in the ternary phase diagram shown in FIG. 1, i.e., the region where "0.70≤y/(x+y)≤0.98, 0.45≤z≤0.55, 0<w≤0.35, and x+y+z=1".

FIG. 5 is a graph illustrating the relationship between a resistivity at 25° C. and a B constant based on the above results. FIG. 6 is a graph illustrating the relationship between a Al/(V+Al) ratio and a B constant. These graphs shows that the materials, the composition ratios of which fall within the region where Al/(V+Al) is from 0.7 to 0.98 and (N+O)/(V+Al+N+O) is from 0.45 to 0.55 and each crystal system of which is a hexagonal wurtzite-type single phase, have a specific resistance value at a temperature of 25° C. of 100 Ωcm or higher and a B constant of 1500 K or higher, which is the region realizing a high resistance and a high B constant. In data shown in FIG. 6, the reason why the B constant varies with respect to the same Al/(V+Al) ratio is because the materials have different amounts of nitrogen and/or oxygen in their crystals or different amounts of lattice defects such as nitrogen and/or oxygen defects.

In the materials according to Comparative Examples 2 and 3 shown in Table 1, the composition ratios fall within the region where Al/(V+Al)<0.7, and the crystal systems are a cubic NaCl-type. Thus, a material with the composition ratio that falls within the region where Al/(V+Al)<0.7 has a specific resistance value at a temperature of 25° C. of less than 100 Ωcm and a B constant of less than 1500 K, which is the region of low resistance and low B constant.

The material according to Comparative Example 1 shown in Table 1 has a composition ratio that falls within the region where (N+O)/(V+Al+N+O) is less than 40% and is in a crystal state where nitridation of metals contained therein is insufficient. The material according to Comparative Example 1 was neither a NaCl-type nor wurtzite-type and had very poor crystallinity. In addition, it was found that the material according to this Comparative Example exhibited near-metallic behavior because both the B constant and the resistance value were very small.

(4) Thin Film X-Ray Diffraction (Identification of Crystal Phase)

The crystal phases of the thin film thermistor portions 3 obtained by the reactive sputtering method were identified by Grazing Incidence X-ray Diffraction. The thin film X-ray diffraction is a small angle X-ray diffraction experiment. The measurement was performed under the conditions of Cu X-ray tube, an angle of incidence of 1 degree, and 2θ of from 20 to 130 degrees. Some of the samples were measured under the condition of an angle of incidence of 0 degree and 2θ of from 20 to 100 degrees.

As a result of the measurement, a wurtzite-type phase (hexagonal crystal, the same phase as that of AlN) was obtained in the region where Al/(V+Al)≥0.7, whereas a NaCl-type phase (cubic crystal, the same phase as that of VN) was obtained in the region where Al/(V+Al)<0.66. In addition, it is considered that two coexisting crystal phases of a wurtzite-type phase and a NaCl-type phase will be obtained in the region where 0.66<Al/(V+Al)<0.7.

Thus, in the $V_xAl_y(N,O)_z$-based material, the region of high resistance and high B constant can be realized by the wurtzite-type phase where Al/(V+Al)≥0.7. In the materials according to Examples of the present invention, no impurity phase was confirmed and the crystal structure thereof was a wurtzite-type single phase.

In the material according to Comparative Example 1 shown in Table 1, the crystal phase thereof was neither a wurtzite-type nor NaCl-type as described above, and thus, could not be identified in the testing. In this Comparative Example, the peak width of XRD was very large, showing that the material had very poor crystallinity. It is considered that the crystal phase thereof was a metal phase with insufficient nitridation because they exhibited near-metallic behavior from the viewpoint of electric properties.

TABLE 1

| | CRYSTAL SYSTEM | XRD PEAK INTENSITY RATIO OF (100)/(002) WHEN CRYSTAL PHASE IS WURTZITE TYPE | CRYSTAL AXIS EXHIBITING STRONG DEGREE OF ORIENTATION IN VERTICAL DIRECTION WITH RESPECT TO SUBSTRATE SURFACE WHEN CRYSTAL PHASE IS WURTZITE TYPE (a-AXIS OR c-AXIS) | SPUTTERING GAS PRESSURE (Pa) | COMPOSITION RATIO | | |
|---|---|---|---|---|---|---|---|
| | | | | | V/(V+Al+N+O) (%) | Al/(V+Al+N+O) (%) | N/(V+Al+N+O) (%) |
| COMPARATIVE EXAMPLE 1 | UNKNOWN INSUFFICIENT NITRIDATION | — | — | — | 16 | 52 | 25 |
| COMPARATIVE EXAMPLE 2 | NaCl TYPE | — | — | — | 23 | 27 | 41 |
| COMPARATIVE EXAMPLE 3 | NaCl TYPE | — | — | — | 25 | 26 | 41 |
| EXAMPLE 1 | WURTZITE TYPE | 0.59 | c-AXIS | <0.7 | 4 | 45 | 40 |
| EXAMPLE 2 | WURTZITE TYPE | 0.30 | c-AXIS | <0.7 | 1 | 46 | 36 |
| EXAMPLE 3 | WURTZITE TYPE | 0.66 | c-AXIS | <0.7 | 2 | 45 | 36 |
| EXAMPLE 4 | WURTZITE TYPE | 0.21 | c-AXIS | <0.7 | 8 | 39 | 47 |
| EXAMPLE 5 | WURTZITE TYPE | 0.06 | c-AXIS | <0.7 | 12 | 36 | 48 |
| EXAMPLE 6 | WURTZITE TYPE | 0.26 | c-AXIS | <0.7 | 6 | 42 | 40 |

TABLE 1-continued

| | | | | | | | |
|---|---|---|---|---|---|---|---|
| EXAMPLE 7 | WURTZITE TYPE | 0.05 | c-AXIS | <0.7 | 6 | 41 | 42 |
| EXAMPLE 8 | WURTZITE TYPE | 0.42 | c-AXIS | <0.7 | 5 | 43 | 40 |
| EXAMPLE 9 | WURTZITE TYPE | 0.23 | c-AXIS | <0.7 | 5 | 43 | 47 |
| EXAMPLE 10 | WURTZITE TYPE | 1.47 | a-AXIS | ≥0.7 | 6 | 41 | 36 |
| EXAMPLE 11 | WURTZITE TYPE | 1.57 | a-AXIS | ≥0.7 | 14 | 39 | 37 |
| EXAMPLE 12 | WURTZITE TYPE | 3.65 | a-AXIS | ≥0.7 | 7 | 45 | 35 |
| EXAMPLE 13 | WURTZITE TYPE | 3.50 | a-AXIS | ≥0.7 | 6 | 41 | 36 |
| EXAMPLE 14 | WURTZITE TYPE | 1.65 | a-AXIS | ≥0.7 | 4 | 49 | 37 |

| | COMPOSITION RATIO | | | | | RESULTS OF ELECTRIC PROPERTIES | |
|---|---|---|---|---|---|---|---|
| | O/(V + Al + N + O) (%) | Al/(V + Al) (%) | (N + O)/(V + Al + N + O) (%) | N/(V + Al + N) (%) | O/(N + O) (%) | B CONSTANT (K) | SPECIFIC RESISTANCE VALUE AT 25° C. (Ωcm) |
| COMPARATIVE EXAMPLE 1 | 7 | 77 | 32 | — | — | 13 | 9.E+00 |
| COMPARATIVE EXAMPLE 2 | 9 | 55 | 50 | — | — | 338 | 9.E+01 |
| COMPARATIVE EXAMPLE 3 | 8 | 51 | 49 | — | — | 266 | 7.E+01 |
| EXAMPLE 1 | 11 | 93 | 51 | 45 | 21 | 4320 | 2.E+07 |
| EXAMPLE 2 | 17 | 98 | 53 | 43 | 31 | 6486 | 7.E+08 |
| EXAMPLE 3 | 17 | 97 | 53 | 44 | 31 | 5557 | 7.E+08 |
| EXAMPLE 4 | 6 | 83 | 53 | 50 | 11 | 2511 | 6.E+04 |
| EXAMPLE 5 | 4 | 74 | 52 | 50 | 8 | 1965 | 7.E+02 |
| EXAMPLE 6 | 12 | 87 | 52 | 45 | 24 | 2721 | 2.E+05 |
| EXAMPLE 7 | 11 | 87 | 52 | 47 | 20 | 2844 | 2.E+05 |
| EXAMPLE 8 | 12 | 89 | 52 | 45 | 24 | 2949 | 3.E+05 |
| EXAMPLE 9 | 5 | 89 | 52 | 49 | 10 | 3064 | 2.E+05 |
| EXAMPLE 10 | 17 | 88 | 53 | 44 | 31 | 2593 | 2.E+05 |
| EXAMPLE 11 | 10 | 74 | 47 | 41 | 22 | 1742 | 9.E+02 |
| EXAMPLE 12 | 13 | 87 | 48 | 41 | 27 | 2549 | 1.E+05 |
| EXAMPLE 13 | 17 | 88 | 53 | 43 | 33 | 2695 | 2.E+05 |
| EXAMPLE 14 | 10 | 93 | 47 | 42 | 21 | 3792 | 2.E+07 |

Next, since all the materials according to the Examples of the present invention were wurtzite-type phase films having strong orientation, whether the films have a strong a-axis orientation or c-axis orientation in the crystal extending in a vertical direction (film thickness direction) with respect to the Si substrate (S) was examined by XRD. At this time, in order to examine the orientation of the crystal axis, the peak intensity ratio of (100)/(002) was measured, where (100) is the hkl index indicating a-axis orientation and (002) is the hkl index indicating c-axis orientation.

As a result of the measurement, in the Examples in which film deposition was performed at a sputtering gas pressure of less than 0.7 Pa, the intensity of (002) was much stronger than that of (100), that is, the films exhibited a stronger c-axis orientation than a-axis orientation. On the other hand, in the Examples in which film deposition was performed at a sputtering gas pressure of 0.7 Pa or higher, the intensity of (100) was much stronger than that of (002), that is, the films exhibited a stronger a-axis orientation than c-axis orientation.

Note that it was confirmed that a wurtzite-type single phase was formed in the same manner even when the thin film thermistor portion 3 was deposited on a polyimide film under the same deposition condition. It was also confirmed that the crystal orientation did not change even when the thin film thermistor portion 3 was deposited on a polyimide film under the same deposition condition.

FIG. 7 shows an Exemplary XRD profile of a material according to an Example exhibiting a strong c-axis orientation. In this Example, Al/(V+Al) was equal to 0.87 (wurtzite-type, hexagonal crystal), and the measurement was performed at a 1 degree angle of incidence. As can be seen from the result, the intensity of (002) was much stronger than that of (100) in this Example.

FIG. 8 shows an Exemplary XRD profile of a material according to an Example exhibiting a strong a-axis orientation. In this Example, Al/(V+Al) was equal to 0.88 (wurtzite-type, hexagonal crystal), and the measurement was performed at a 1 degree angle of incidence. As can be seen from the result, the intensity of (100) was much stronger than that of (002) in this Example.

The asterisk (*) in the graphs shows the peak originating from the device or the Si substrate with a thermal oxidation film, and thus, it was confirmed that the peak with the asterisk (*) in the graphs was neither the peak originating from a sample itself nor the peak originating from an impurity phase. In addition, a symmetrical measurement was performed at a 0 degree angle of incidence, confirming that the peak indicated by (*) was lost in the symmetrical measurement, and thus, that it was the peak originating from the device or the Si substrate with a thermal oxidation film.

Next, the correlations between crystal structures and their electric properties were further compared with each other in detail regarding Examples of the present invention in which the wurtzite-type materials were employed.

As shown in FIG. 9, the crystal axis of some materials according to the Examples is strongly oriented along the c-axis in a vertical direction with respect to the surface of the substrate and that of other materials according to the Examples is strongly oriented along the a-axis in a vertical direction with respect to the surface of the substrate among the materials having nearly the same Al/(V+Al) ratio.

When both groups are compared to each other, it can be found that the materials having a strong c-axis orientation have a higher B constant by about 100 K than that of the materials having a strong a-axis orientation provided that they have the same Al/(V+Al) ratio. When focus is placed on the amount of N (i.e., N/(V+Al+N+O)), it can be found that the materials having a strong c-axis orientation have a slightly larger amount of nitrogen than that of the materials having a strong a-axis orientation.

Next, the wurtzite-type materials according to Examples of the present invention were further examined for the correlation between the amounts of nitrogen and oxygen. FIG. 10 shows the examination result of the relationship between a N/(V+Al+N) ratio and a O/(N+O) ratio. As can be seen from this result, a sample having a lower N/(V+Al+N) ratio has a higher O/(N+O) ratio. It is also shown that the material exhibiting a strong c-axis orientation needs less oxygen.

<Crystalline Form Evaluation>

FIG. 11 shows a cross-sectional SEM photograph of the thin film thermistor portion 3 according to the Example (where Al/(V+Al)=0.87, wurtzite-type, hexagonal crystal, and strong c-axis orientation), in which the thin film thermistor portion 3 having a thickness of about 450 nm was deposited on the Si substrate (S) with a thermal oxidation film, as an exemplary crystalline form in the cross-section of the thin film thermistor portion 3. FIG. 12 shows a cross-sectional SEM photograph of the thin film thermistor portion 3 according to another Example (where Al/(V+Al)=0.88, wurtzite-type, hexagonal crystal, and strong a-axis orientation).

The samples in these Examples were obtained by breaking the Si substrates (S) by cleavage. The photographs were taken by tilt observation at an angle of 45 degrees.

As can be seen from these photographs, the samples were formed of high-density columnar crystals in both Examples. Specifically, the growth of columnar crystals in a vertical direction with respect to the surface of the substrate was observed in both Examples revealing a strong c-axis orientation and revealing a strong a-axis orientation. Note that the break of the columnar crystal was generated upon breaking the Si substrate (S) by cleavage.

The columnar crystal sizes of the samples according to the Example revealing a strong c-axis orientation in FIG. 10 and the Example revealing a strong a-axis orientation in FIG. 11 were about 10 nmφ (±5 nmφ) and 15 nmφ (±10 nmφ) in grain size, respectively, and were about 450 nm in length for both. The grain size here is the diameter of a columnar crystal along the surface of a substrate, and the length is that of a columnar crystal in a vertical direction with respect to the surface of the substrate (film thickness).

When the aspect ratio of a columnar crystal is defined as "length/grain size", both materials according to the Example revealing a strong c-axis orientation and the Example revealing a strong a-axis orientation have an aspect ratio of 10 or higher. It is contemplated that the films have a high density due to the small grain size of a columnar crystal.

It was also confirmed that when a film having a thickness of 200 nm, 500 nm, or 1000 nm was deposited on the Si substrate (S) with a thermal oxidation film, high-density columnar crystals were formed as described above.

<Heat Resistance Test Evaluation>

For the thin film thermistor portions 3 according to some of the Examples and the Comparative Example shown in Table 1, a resistance value and a B constant before and after the heat resistance test at a temperature of 125° C. for 1000 hours in air were evaluated. The results are shown in Table 2. The thin film thermistor portion 3 according to the Comparative Example made of a conventional Ta—Al—N-based material was also evaluated in the same manner for comparison. In addition, for reference, the thin film thermistor portion 3 according to Reference Example 1 made of a V—Al—N based material (wurtzite-type, hexagonal crystal, strong c-axis orientation), which was formed by performing reactive sputtering under a mixed gas (nitrogen gas+Ar gas) atmosphere containing no oxygen gas, was similarly subject to the heat resistance test. The result is also shown in Table 2.

As can be seen from these results, although the Al concentration and the nitrogen concentration vary, both the rising rate of a resistance value and the rising rate of a B constant of the $V_xAl_y(N,O)_z$-based materials according to the Examples are smaller, and the heat resistance thereof based on the change of electric properties before and after the heat resistance test is more excellent as compared with the Ta—Al—N-based material according to the Comparative Example when both materials have almost the same B constant. Note that the materials according to Examples 6 and 7 have a strong c-axis orientation, and the materials according to Examples 12 and 13 have a strong a-axis orientation. When both groups are compared to each other, the rising rate of a resistance value of the materials according to the Examples exhibiting a strong c-axis orientation is smaller and the heat resistance thereof is slightly improved as compared with the materials according to the Examples exhibiting a strong a-axis orientation.

In addition, it can be found that although the heat resistance of the V—Al—N-based material according to Reference Example 1, which does not positively contain oxygen, is more excellent than that of the Comparative Example, the V—Al—N—O-based materials according to the Examples of the present invention, which positively contain oxygen, have lower rising rate of resistance value and more excellent heat resistance as compared with Reference Example 1.

Note that, in the Ta—Al—N-based material, the ionic radius of Ta is very large compared to that of V and Al, and thus, a wurtzite-type phase cannot be produced in the high-concentration Al region. It is contemplated that the V—Al—N-based or V—Al—N—O-based material having a wurtzite-type phase has a better heat resistance than the Ta—Al—N-based material because the Ta—Al—N-based material is not a wurtzite-type phase.

TABLE 2

| | M ELEMENT | M(%) | Al(%) | N(%) | O(%) | Al/(M + Al) (%) | B25-50 (K) | SPECIFIC RESISTANCE VALUE AT 25° C. (Ωcm) | RISING RATE OF SPECIFIC RESISTANCE AT 25° C. AFTER HEAT RESISTANCE TEST AT 125° C. FOR 1,000 HOURS (%) | RISING RATE OF B CONSTANT AFTER HEAT RESISTANCE TEST AT 125° C. FOR 1,000 HOURS (%) |
|---|---|---|---|---|---|---|---|---|---|---|
| COMPARATIVE EXAMPLE | Ta | 59 | 2 | 35 | 5 | 3 | 2688 | 6.E+02 | 12 | 6 |
| EXAMPLE 6 | V | 6 | 42 | 40 | 12 | 87 | 2721 | 2.E+05 | <1 | <1 |
| EXAMPLE 7 | V | 6 | 41 | 42 | 11 | 87 | 2844 | 2.E+05 | <1 | <1 |
| EXAMPLE 12 | V | 7 | 45 | 35 | 13 | 87 | 2549 | 1.E+05 | <2 | <1 |
| EXAMPLE 13 | V | 6 | 41 | 36 | 17 | 88 | 2695 | 2.E+05 | <2 | <1 |
| REFERENCE EXAMPLE 1 | V | 6 | 47 | 47 | — | 89 | 2830 | 1.E+05 | <4 | <1 |

The technical scope of the present invention is not limited to the aforementioned embodiments and Examples, but the present invention may be modified in various ways without departing from the scope or teaching of the present invention.

REFERENCE NUMERALS

1: film type thermistor sensor, 2: insulating film, 3: thin film thermistor portion, 4 and 124: pattern electrode

What is claimed is:

1. A metal nitride material for a thermistor, consisting of a metal nitride represented by the general formula: $V_xAl_y(N_{1-w}O_w)_z$ (where $0.70 \leq y/(x+y) \leq 0.98$, $0.45 \leq z \leq 0.55$, $0 < w \leq 0.35$, and $x+y+z=1$), wherein the crystal structure thereof is a hexagonal wurtzite-type single phase.

2. The metal nitride material for a thermistor according to claim 1, wherein the metal nitride material is deposited as a film and is a columnar crystal extending in a vertical direction with respect to the surface of the film.

3. The metal nitride material for a thermistor according to claim 1, wherein the metal nitride material is deposited as a film and is more strongly oriented along the c-axis than the a-axis in a vertical direction with respect to the surface of the film.

4. A film type thermistor sensor comprising:
an insulating film;
a thin film thermistor portion made of the metal nitride material for a thermistor according to claim 1 formed on the insulating film; and
a pair of pattern electrodes formed at least on the top or the bottom of the thin film thermistor portion.

5. A method for producing the metal nitride material for a thermistor according to claim 1, the method comprising a deposition step of performing film deposition by reactive sputtering in a nitrogen and oxygen-containing atmosphere using a V—Al alloy sputtering target.

6. The method for producing the metal nitride material for a thermistor according to claim 5, wherein the sputtering gas pressure during the reactive sputtering is set to less than 0.7 Pa.

* * * * *